(12) United States Patent
Koide

(10) Patent No.: US 7,057,272 B2
(45) Date of Patent: Jun. 6, 2006

(54) POWER SUPPLY CONNECTION STRUCTURE TO A SEMICONDUCTOR DEVICE

(75) Inventor: Masateru Koide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/986,151

(22) Filed: Nov. 12, 2004

(65) Prior Publication Data
US 2005/0146017 A1 Jul. 7, 2005

Related U.S. Application Data

(63) Continuation of application No. PCT/JP02/06430, filed on Jun. 26, 2002.

(51) Int. Cl.
*H01L 23/52* (2006.01)
*H01L 23/48* (2006.01)

(52) U.S. Cl. ............... 257/691; 257/693; 257/698; 257/731; 257/734

(58) Field of Classification Search ............... 257/691, 257/693, 698, 701–703, 705–707, 712, 713, 257/731, 734
See application file for complete search history.

(56) References Cited

U.S. PATENT DOCUMENTS 5,488,255 A * 1/1996 Sato et al. ............ 257/718
6,907,658 B1 * 6/2005 Li ........................ 29/832

FOREIGN PATENT DOCUMENTS

| EP | 0 414 204 A2 * | 8/1990 |
|---|---|---|
| JP | 01-218052 | 8/1989 |
| JP | 6-88193 | 12/1994 |
| JP | 11-121643 | 4/1999 |
| JP | 2000-349448 | 12/2000 |
| JP | 2001-044318 | 2/2001 |
| JP | 2001-223301 | 8/2001 |

\* cited by examiner

*Primary Examiner*—Jasmine Clark
(74) *Attorney, Agent, or Firm*—Staas & Halsey LLP

(57) ABSTRACT

A package substrate has a power supply path different from a signal supply path to a semiconductor element. A semiconductor element is mounted on a first surface of the package substrate. A second surface opposite to the first surface is provided with external connection terminals. A power supply layer is formed inside the package substrate. The package substrate has electrode terminals provided in a part other than the second surface. The electrode terminals are connected to the power supply layer.

11 Claims, 5 Drawing Sheets

POWER SUPPLY CONNECTION STRUCTURE TO A SEMICONDUCTOR DEVICE

CROSS-REFERENCE TO RELATED APPLICATION

This application is a U.S. continuation application filed under 35 U.S.C. 111(a) claiming benefit under 35 U.S.C. 120 and 365(c) of PCT application JP02/06430, filed Jun. 26, 2002.

BACKGROUND OF THE INVENTION

1. Field of the Invention

The present invention relates to semiconductor devices and, more particularly, to a power supply connection structure for supplying a power to a semiconductor device such as a large-scale integrated circuit (LSI), which is mounted and packaged on a circuit board.

2. Description of the Related Art

In large-scale integrated circuit (LSI) such as a CPU or MPU, high integration (high-densification) of a circuit is increasingly apt to progress. With such a high-integration, a power consumption of one LSI has been increased, and at present an LSI having a power consumption of 30 W to 100 W has been developed.

Additionally, a number of signals supplied to an LSI also increases with the high-integration of a circuit, and a number of terminals for signals and a number of terminals for power supply and grounding must be increased. In the present LSI, a ball grid array (BGA) type is mainly used in which solder balls as external connection terminals are provided in a grid-like arrangement on a back surface of a substrate on which a semiconductor chip.

If a number of terminals of an LSI package is increased, a wiring pattern formed in a package substrate must be minute. Therefore, an allowable value of a current, which can be supplied to the wiring within the package substrate, is decreased. On the other hand, a power supply voltage of an LSI has become lower, and it is being shifted to a power supply voltage of 5 V to 1 V. If it is the same power consumption, a current is increased when a power supply voltage is decreased. Therefore, it is necessary to supply a larger current to power source wiring in the package substrate than signal wiring.

FIG. 1 is a cross-sectional view of a substrate unit showing an electric power supply structure to a conventional LSI package. In FIG. 1, an LSI package 1 is mounted on a substrate 2 such as a motherboard or a daughter-board. Solder balls 3 as external connection terminals of the LSI package 1 are connected to electrode pads 4 on the substrate 2.

The LSI package 1 comprises a semiconductor chip (LSI) 5 and a package substrate 6. The LSI 5 is mounted to the package substrate 6, and signals and electric power are supplied to the LSI 5 through the wiring in the package substrate 6. A DC-DC converter 7 is mounted in the substrate 2 so as to control a power supply voltage supplied to the LSI package 1. The DC-DC converter 7 lowers the voltage supplied from a power source line 8A in the substrate 2 to the power supply voltage for the LSI package 1. For example, a voltage of 48 V or 24 V is supplied to the power source line 8A in the substrate 2, lowered to 1.8 V or 1 V by the DC-DC converter 7, and is supplied to a power supply line 8B. The power supply line 8B is connected to the solder ball 3 of the LSI package 1 through the electrode pad 4, and the power supply voltage of 1.8 V or 1 V is supplied to the package substrate 6. Similarly, a grounding line 9A is connected to the package substrate 6 through the DC-DC converter 7, a grounding line 9B, an electrode pad 4, and the solder ball 3.

Generally, in the package substrate 6, a power supply layer 10 and a grounding layer 11 are provided to extend in the form of plane. The power supply to the LSI package 1 is achieved by supplying a power from the substrate 2 to the power supply layer 10 first, and a power is supplied from the power supply layer 10 to each power supply terminal of the LSI package. There is no problem in the power supply from the power supply layer 10 to the semiconductor chip (LSI) 5 even if the cross-sectional area of the power supply path is comparatively small since a value of the current to be supplied is comparatively small. On the other hand, it is necessary to supply a large current to be consumed by the entire LSI 5 to the power supply path from the solder ball 3 to the power source layer 10, and, thus, a large cross-sectional area must be acquired so as to maintain a large allowable current value.

FIG. 2 is an enlarged cross-sectional view of a part of a build-up substrate, which is an example of the package substrate 6 shown in FIG. 1.

Generally, a build-up substrate is formed by providing the power source layer 10 on one side of a core substrate 12 as a center and providing a grounding layer on the other side of the core substrate 12. Then, signal wiring is formed on both sides of the core substrate 12, connection electrode pads 13 are provided on one side, and electrode pads for forming the solder balls 3 are provided on the other side.

On the assumption that the solder balls 3 shown in FIG. 2 correspond to the power supply terminals, a large current flows from the solder balls 3 to the power supply layer 10 in FIG. 2. Here, a part between the solder balls 3 and the power supply layer 10 contains vias 15 which penetrate through the layers of the build-up substrate.

A diameter of a via formed in a built-up substrate is in a range of about 50 μm to 100 μm, and the diameter of the via must be reduced if a number of terminals is increased. Thus, a permissible current for one via is limited to about 500 mA. That is, for example, in order to supply an electric power to an LSI of power consumption of 100 W, 200 vias having a permissible current of 500 mA are needed on the assumption that 1 V is applied to each via. Since one via is provided to one terminal (solder ball 3), it is required to provide 200 terminals (solder balls 3) for power supply.

Therefore, if the number of power supply terminals is increase without decreasing the number of signal terminals, the number of terminals in the entire package substrate. Thus, there is a problem in that a size of the package substrate must be increased.

Moreover, if the power supply voltage of an LSI becomes low, a noise tends easily enter the power source line, and it is desired to reduce a length of the power source line.

SUMMARY OF THE INVENTION

It is a general object of the present invention to provide an improved and useful power supply connection structure in which the above-mentioned problems are eliminated.

A more specific object of the present invention is to provide a package substrate having a power supply path different from a signal supply path to a semiconductor element.

Another object of the present invention is to provide a substrate unit constituting an electric power supply path containing a DC-DC converter for supplying power to a semiconductor device.

A further object of the present invention is to provide a DC-DC converter which can supply a power to a semiconductor device without routing a substrate.

There is provided according to one aspect of the present invention a semiconductor device comprising a package substrate including: a first surface on which a semiconductor element is mounted; a second surface opposite to the first surface and provided with external connection terminals thereon; and a power supply layer formed inside the package substrate, wherein the package substrate has electrode terminals provided in a part other than the second surface, and the electrode terminals are connected to the power supply layer. In the semiconductor device according to the present invention, the electrode terminals are formed on the first surface of the package substrate and connected to the power supply layer through vias formed in the package substrate.

Additionally, there is provided according to another aspect of the present invention a semiconductor device comprising a package substrate including: a first surface on which a semiconductor element is mounted; a second surface opposite to the first surface and provided with external connection terminals thereon; and a power supply layer formed inside the package substrate, wherein a part of the power supply layer is exposed from the package substrate. The package substrate may have a grounding layer formed therein, and a part of the grounding layer may be exposed from the package substrate.

Further, there is provided according to another aspect of the present invention a substrate unit comprising: a substrate having a power supply wiring and grounding wiring formed therein; a semiconductor device mounted on the substrate and including a package substrate having a power supply layer and a semiconductor element; and a DC-DC converter mounted on the substrate and having a connector extending toward the semiconductor device so as to produce a voltage to be supplied to the semiconductor device, wherein the connector is connected to electrode terminals formed on the package substrate of the semiconductor device; the electrode terminals are connected to a power supply layer of the package substrate; and an electric power is supplied from the DC-DC converter to the power supply layer of the package substrate through the connector and the electrode terminals. The electrode terminals may be formed on a surface of the package substrate on which the semiconductor element is mounted, and the electrode terminals may be connected to the power supply layer through vias.

There is provided according to another aspect of the present invention a substrate unit comprising: a substrate having a power supply wiring and grounding wiring formed therein; a semiconductor device mounted on the substrate and including a package substrate having a power supply layer and a semiconductor element; and a DC-DC converter mounted on the substrate and having a connector extending toward the semiconductor device so as to produce a voltage to be supplied to the semiconductor device, wherein the connector is connected to the power supply layer exposed from the package substrate of the semiconductor substrate, and an electric power is supplied from the DC-DC converter to the power supply layer of the package substrate through the connector. The package substrate may have a grounding layer formed therein, a part of the grounding layer may be exposed from the package substrate, and the DC-DC converter may have a connector connected to an exposed part of the grounding layer.

Additionally, there is provided according another aspect of the present invention a DC-DC converter for supplying an electric power to a semiconductor device, comprising: a body having a voltage conversion circuit formed therein: terminals configured and arranged to be connected to a power supply wiring of a substrate; and a connector extending toward the semiconductor device and configured and arranged to be brought into contact with a predetermined part of the semiconductor device when the DC-DC converter is mounted on the substrate. The connector may be configured and arranged to be connected to electrode terminals formed on a surface of a package substrate of the semiconductor device on which a semiconductor element is mounted. Alternatively, the connecter may be configured and arranged to be connected to a power supply layer exposed from a package substrate of the semiconductor device.

Other objects, features and advantages of the present invention will become more apparent from the following detailed description when read in conjunction with the accompanying drawings.

DETAILED DESCRIPTION OF THE PREFERRED EMBODIMENTS

Figure 1:
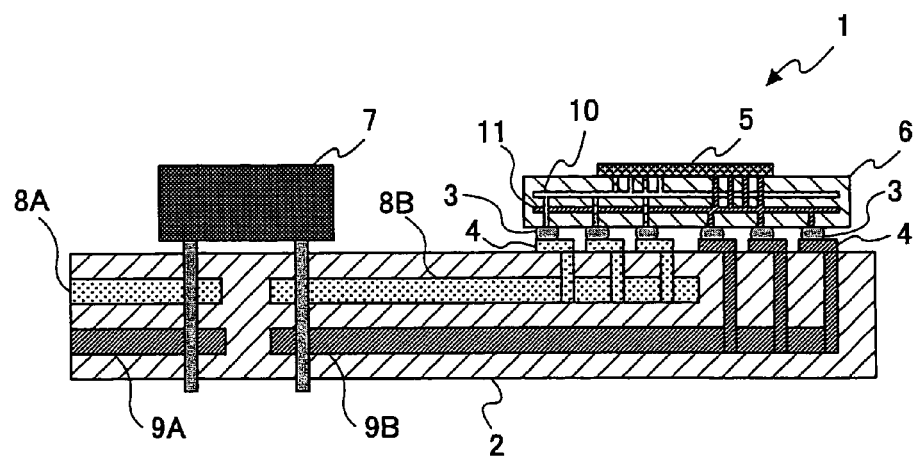
FIG. 1 is a cross-sectional view of a substrate unit having an electric power supply structure to a conventional LSI package.
Figure 3:
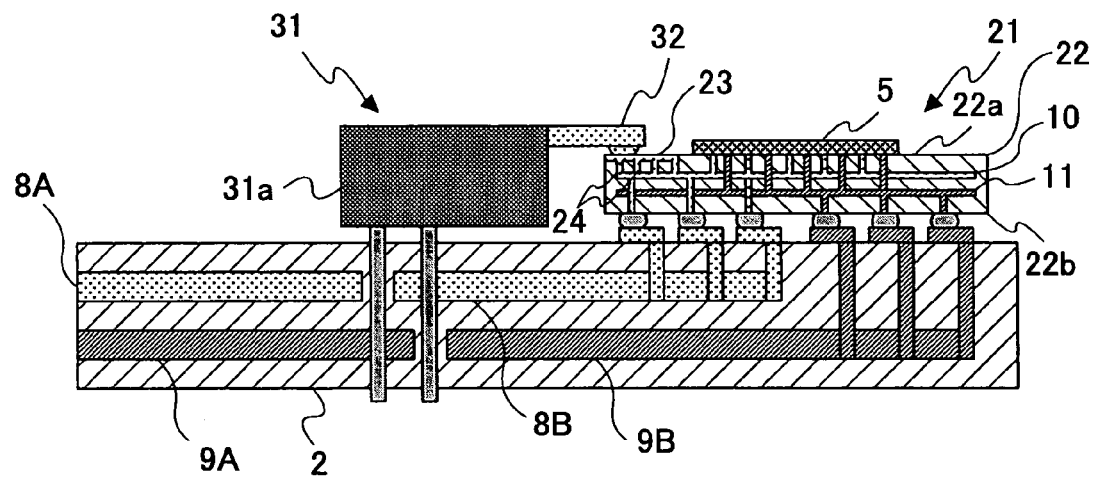
FIG. 3 is a cross-sectional view of a substrate unit according to a first embodiment of the present invention.

A description will now be given, with reference to FIG. 3, of a first embodiment of the present invention. FIG. 3 is a cross-sectional view of a substrate unit according to the first embodiment of the present invention. In FIG. 3, parts that are the same as the parts shown in FIG. 1 are given the same numerals, and descriptions there of will be omitted.

The substrate unit shown in FIG. 3 comprises an LSI package 21 (semiconductor device) and a DC-DC converter 31 that are mounted on a substrate 2. In the LSI package 21, an LSI 5 is mounted on a first surface 22a of a package substrate 22, and the solder balls 3 as external connection terminals are formed on a second surface 22b of the package substrate 22. Similar to the conventional device, the LSI package 21 is connected to a power supply line (power supply wiring) 8B and grounding line (grounding wiring) 9B of the substrate 2 through the solder balls 3 as external connection terminals.

In the present embodiment, in addition to the above-mentioned power supply line and grounding-line, electric power is supplied directly to the package substrate 22 of the LSI package from the DC-DC converter 31 without going through the substrate 2. That is, the DC-DC converter 31 according to the present embodiment has a connector 32, which extends from a main part 31a, of the DC-DC converter 31, having a voltage conversion circuit therein so that connector 32 is supplied with a voltage to be supplied to the LSI package 21 (that is, in addition to a voltage to be supplied to LSI package 21 through the power source line 8B of the substrate 2). Accordingly, an electric power (electric current) can be supplied from the DC-DC converter 31 to the package substrate 22 of the LSI package through the connector other than the path going through the substrate 2.

In order to enable the above-mentioned power supply, the LSI package 21 according to the present embodiment has power supply terminals 23 exposed on the surface 22a (that is, a surface on which the LSI 5 is mounted) opposite to the surface 22b on which the solder balls 3 are provided. The electrode terminals 23 are connected to the power supply layer 10 through a plurality of vias 24. The number of vias 24 is determined based on a value of an electric current which flows from the connector 32 to the power supply layer 10 through the power supply terminals 23.

Figure 2:
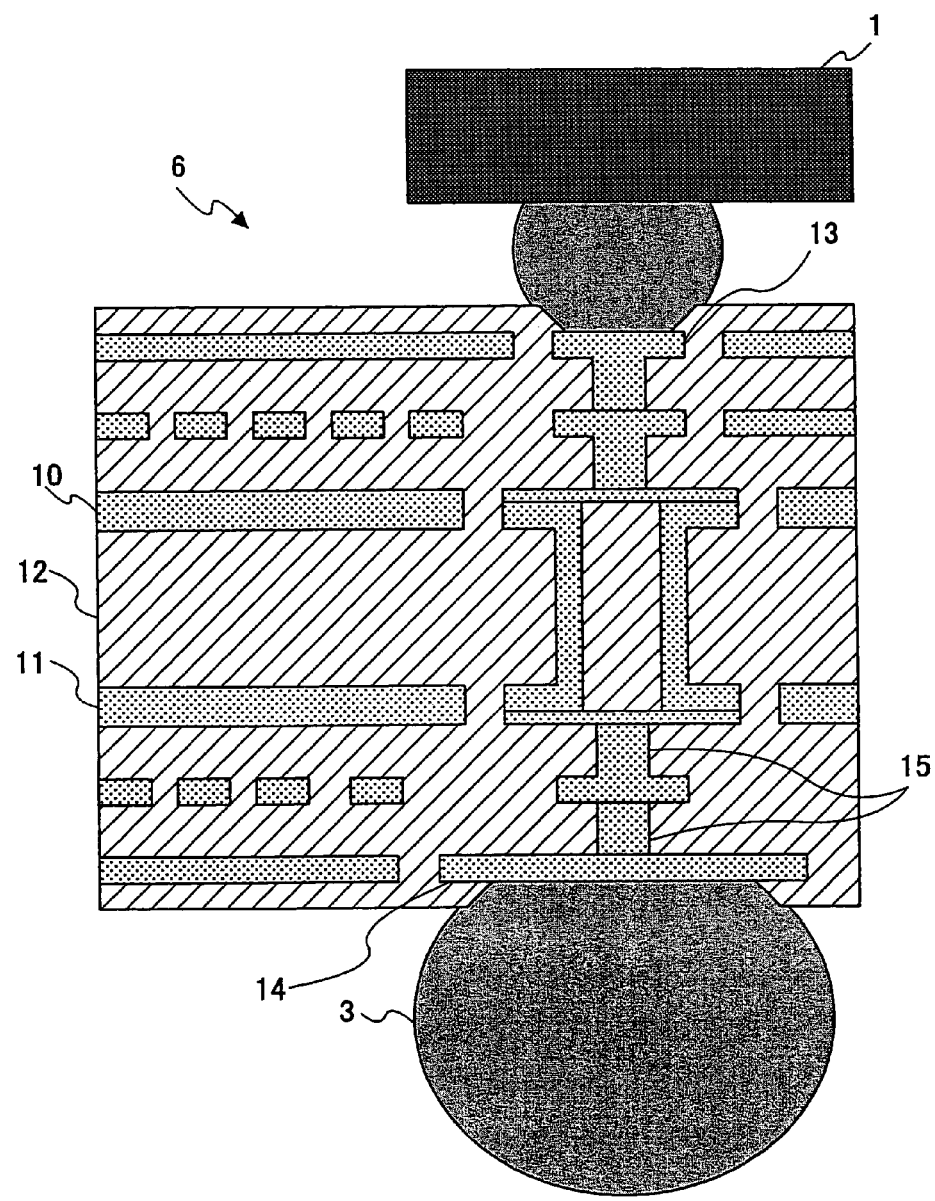
FIG. 2 is an enlarged cross-sectional view of a part of a build-up substrate, which is an example of a package substrate shown in FIG. 1.

As mentioned above, an electric power (electric current) is supplied to the power supply layer 10 in the package substrate 22 of the LSI package through the path via the connector 32 of the DC-DC converter 31 in addition to the path from the DC-DC converter 31 via the power supply line 8B in the substrate 2. Therefore, even if there is a part having a low permissible current value (such as vias 15 in FIG. 2) in the path from the solder balls 3 to the power supply layer 10 via the substrate 2, a sufficiently large electric current can be supplied to the LSI package 21 since an electric current can be supplied through the path via the connecter 32.

Moreover, by arranging the DC-DC converter 31 at a position close to the LSI package 21, the distance between the DC-DC converter 31 to the power supply layer 10 is reduced, which reduces a probability of noise entering the current path to the LSI package 21.

Figure 4:
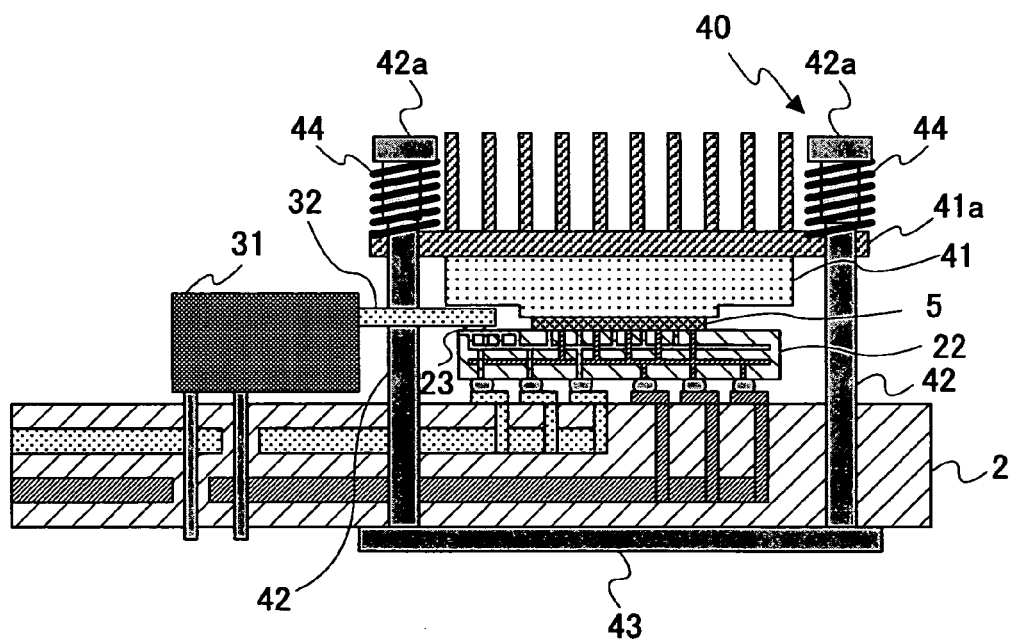
FIG. 4 is a side view of a mounting apparatus for pressing and fixing a connector to an electrode terminal.

Next, a description will be given, with reference to FIG. 4, of a mechanism for connecting the above-mentioned connector 32 of the DC-DC converter 31 to the electrode terminal 23 of the package substrate 22. FIG. 4 is a side view of a mounting apparatus 40 for pressing and fixing the connector 32 to the electrode terminal 23.

The mounting apparatus 40 shown in FIG. 4 is also serves as an apparatus for mounting a heat spreader 41 to the LSI package 21. That is, the mounting apparatus 40 presses and fixes the heat spreader 41 to a back surface of the LSI 5. Using the heat spreader 41, the connector 32 is sandwiched between the heat spreader 41 and the package substrate 22 and fixed. More specifically, the heat spreader 41 is placed on the connector in a state where a contact part formed on an end of the connector 32 is in contact with the electrode terminal 23 of the package substrate 22, and is fixed by a fixing mechanism of the mounting apparatus 40.

The fixing mechanism of the mounting apparatus may be of a conventional screw-fixing type using a pressing force of a spring. The heat spreader 41 is fixed by screwing an end of each of columns 42, which penetrate through four corners of a fin part 41a of the heat spreader 41, into a screw hole of a screw plate 43. That is, each column 42 penetrates the fin part 41a and also penetrates the substrate 2. A screw is formed at the end of each column 42, and a spring 44 is pressed at the same time a nut 42a is screwed, which generates a contact pressure. The spring 44 is provided to each column 42 above the fin part 41a so that the spring 44 is compressed between the fin part 41a and a flange part 42a. The heat spreader 41 is pressed by the spring force of the spring 44 toward the LSI 5, and, thereby, the connector 32 is pressed against the electrode terminal 23 and fixed.

The pressing and fixing mechanism of the connector 23 shown in FIG. 4 is a mere example, and various other mechanisms may be used.

Figure 5:
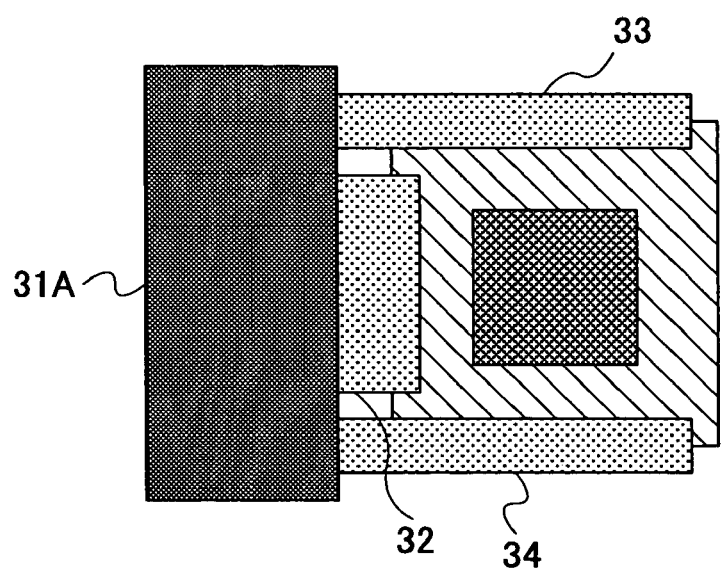
FIG. 5 is a plan of a DC-DC converter, which is a variation of the DC-DC converter shown in FIG. 3.

FIG. 5 is a plan of a variation of the DC-DC converter 31 shown in FIG. 3. A DC-DC converter 31A shown in FIG. 5 has connectors 33 and 34 other than the connector 32 shown in FIG. 3 so that the DC-DC converter 31A can connect to three sides of the package substrate 22 of the LSI package 21. Thereby, the contact area of the connector with the package substrate can be increased, which permits a larger electric current supplied to the electrode terminals of the package substrate.

Figure 6:
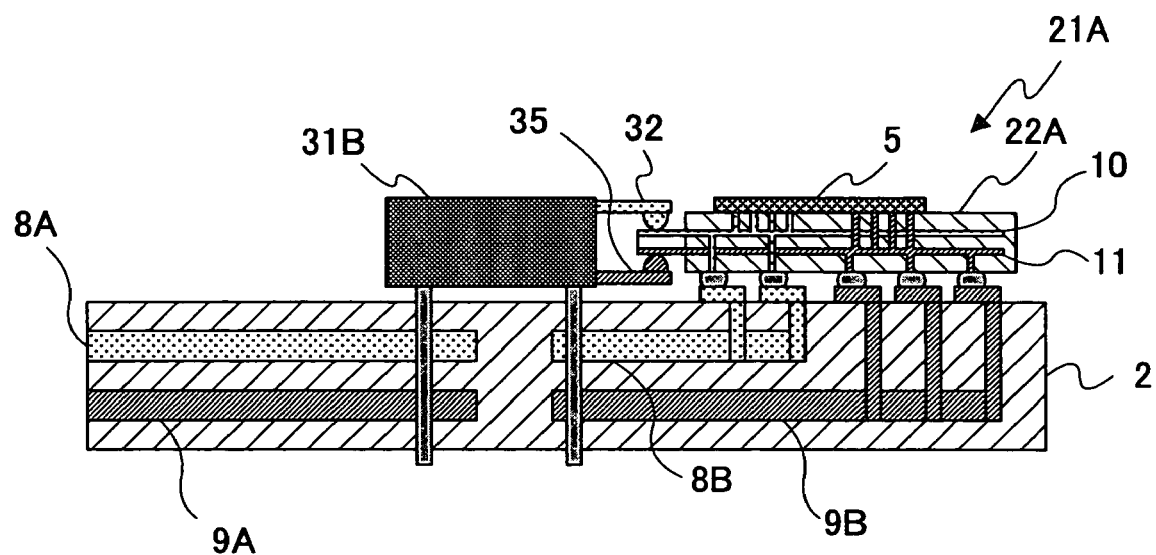
FIG. 6 is a cross-sectional view of a substrate unit, which is provided with a semiconductor device, according to a second embodiment of the present invention.

Next, a description will be given, with reference to FIG. 6, of a second embodiment of the present invention. FIG. 6 is a cross-sectional view of a substrate unit according to the second embodiment of the present invention, which is provided with a semiconductor device. In FIG. 6, parts that are the same with the parts shown in FIG. 1 are given the same reference numerals, and descriptions thereof will be omitted.

In the structure shown in FIG. 6, a power supply layer 10 of a package substrate 22A of the LSI package is exposed, and a connector 32 of a DC-DC converter 31B is directly contacted to the power supply layer 10. Additionally, the DC-DC converter 31B is also provided with a connector 35, which is brought into contact with a grounding layer 11 of the package substrate 22A.

In order to expose the power supply layer 10 and the grounding layer 11, other layers are not formed on parts of the power supply layer 10 and the grounding layer 11, which parts are to be exposed, formed on both sides of the core substrate of the package substrate 22A.

As mentioned above, according to the present embodiment, a portion of the power supply layer 10 in the package substrate 22A of the LSI package 21A is exposed, and the connector 23 of the DC-DC converter 31B contacts the exposed portion directly. Thereby, an electric power (electric current) can be directly supplied from the DC-DC converter 31B to the power supply layer 10.

Moreover, the grounding layer 11 can be connected to the grounding line 9A through the DC-DC converter 31B. As mentioned above, in the present embodiment, an electric current can be supplied through the path going through the connector of the DC-DC converter 31B, in addition to the path from the DC-DC converter 31B and going through the power supply line 8B in the substrate 2. Therefore, even if there is a portion having a low permissible current value in the path from the solder balls 3 to the power supply layer 10 through the substrate 2, a sufficiently large current can be supplied to the LSI package 21 since an electric current can be supplied through the path via the connector 32.

Additionally, the distance between the DC-DC converter 31B and each of the power supply layer 10 and the grounding layer 11 is reduced by arranging the DC-DC convert 31B close to the LSI package 21A, thereby decreasing a possibility of entering noise.

Figure 7:
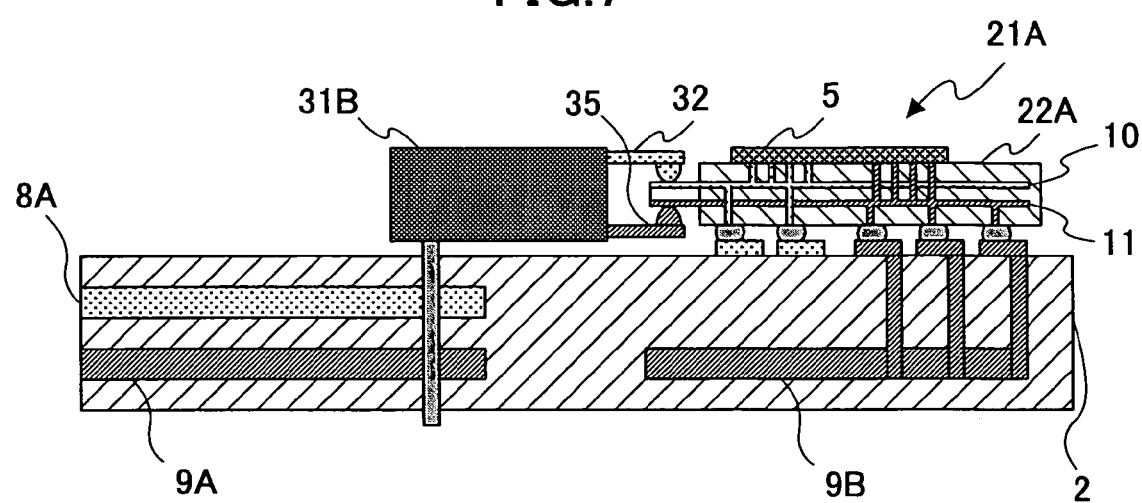
FIG. 7 is a cross-sectional view of a substrate unit, which is a variation of the substrate unit shown in FIG. 6.

FIG. 7 is a cross-sectional view of a substrate unit which is a variation of the substrate unit shown in FIG. 6. In the variation shown in FIG. 7, the power supply path, which is from the DC-DC converter 31B to the solder balls 3 in the substrate 2, is omitted. That is, the power supply line 8B shown in FIG. 6 is omitted, and the supply of an electric power to the power supply layer 10 is only from the connector 32.

Thereby, the terminal used for power supply from among the external connection terminals (solder balls 3) provided in the LSI package 21A can be used for signals, which enables an increase in the number of signal terminals.

The present invention is not limited to the specifically disclosed embodiments, and variations and modifications may be made without departing from the scope of the present invention.

The present invention is base on PCT application JP02/06430, filed Jun. 26, 2002, the entire contents of which are hereby incorporated by reference.

What is claimed is:

1. A semiconductor device comprising a package substrate, including:
   a first surface on which a semiconductor element is mounted;
   a second surface, opposite to the first surface, having external connection terminals thereon; and
   a power supply layer formed inside the package substrate, wherein:
   said package substrate has electrode terminals provided in a part other than said second surface, and the electrode terminals are connected to said power supply layer, and
   the electrode terminals are configured and arranged to be connected to a power supply module so that power is supplied to the power supply layer through the electrode terminals.

2. The semiconductor device as claimed in claim 1, wherein said electrode terminals are formed on said first surface of said package substrate and connected to said power supply layer through vias formed in said package substrate.

3. A semiconductor device comprising a package substrate comprising:
   a first surface on which a semiconductor element is mounted;
   a second surface opposite to the first surface and provided with external connection terminals thereon; and
   a power supply layer formed inside the package substrate, the power supply layer being exposed from said package substrate so that power is supplied to the power supply layer through the electrode terminals.

4. The semiconductor device as claimed in claim 3, wherein said package substrate has a grounding layer formed therein, and a part of the grounding layer is exposed from said package substrate.

5. A substrate unit, comprising:
   a substrate having power supply wiring and grounding wiring formed therein;
   a semiconductor device mounted on the substrate and including a package substrate having a power supply layer and a semiconductor element; and
   a DC-DC converter mounted on said substrate and having a connector extending toward said semiconductor device so as to produce a voltage to be supplied to said semiconductor device, wherein:
   said connector is connected to electrode terminals formed on said package substrate of said semiconductor device,
   the electrode terminals are connected to a power supply layer of said package substrate, and
   electric power is supplied from said DC-DC converter to the power supply layer of said package substrate through said connector and said electrode terminals.

6. The substrate unit as claimed in claim 5, wherein said electrode terminals are formed on a surface of said package substrate on which the semiconductor element is mounted, and said electrode terminals are connected to said power supply layer through vias.

7. A substrate unit, comprising:
   a substrate having power supply wiring and grounding wiring formed therein;
   a semiconductor device mounted on the substrate and including a package substrate having a power supply layer and a semiconductor element; and
   a DC-DC converter mounted on said substrate and having a connector extending toward said semiconductor device so as to produce a voltage to be supplied to said semiconductor device, wherein:
   said connector is connected to said power supply layer exposed from said package substrate of said semiconductor substrate, and
   electric power is supplied from said DC-DC converter to the power supply layer of said package substrate through said connector.

8. The substrate unit as claimed in claim 7, wherein:
   said package substrate has a grounding layer formed therein;
   a part of the grounding layer is exposed from said package substrate; and
   said DC-DC converter has a connector connected to an exposed part of said grounding layer.

9. A DC-DC converter for supplying an electric power to a semiconductor device, comprising:
   a body having a voltage conversion circuit formed therein:
   terminals configured and arranged to be connected to a power supply wiring of a substrate; and
   a connector extending toward said semiconductor device and configured and arranged to be brought into contact with a predetermined part of said semiconductor device when said DC-DC converter is mounted on said substrate.

10. The DC-DC converter as claimed in claim 9, wherein said connector is configured and arranged to be connected to electrode terminals formed on a surface of a package substrate of said semiconductor device on which a semiconductor element is mounted.

11. The DC-DC converter as claimed in claim 9, wherein said connecter is configured and arranged to be connected to a power supply layer exposed from a package substrate of said semiconductor device.

* * * * *

UNITED STATES PATENT AND TRADEMARK OFFICE
CERTIFICATE OF CORRECTION

PATENT NO. : 7,057,272 B2
APPLICATION NO. : 10/986151
DATED : June 6, 2006
INVENTOR(S) : Masateru Koide It is certified that error appears in the above-identified patent and that said Letters Patent is hereby corrected as shown below:

Column 7, Line 36, after "substrate" insert --,--.

Signed and Sealed this

Fourteenth Day of November, 2006

JON W. DUDAS
*Director of the United States Patent and Trademark Office*